US012682135B1

(12) United States Patent
Semple et al.

(10) Patent No.: US 12,682,135 B1
(45) Date of Patent: Jul. 14, 2026

(54) CONTROLLING AGENT MOVEMENT IN DRIVING SIMULATIONS BASED ON VEHICLE LOG DATA

(71) Applicant: Zoox, Inc., Foster City, CA (US)

(72) Inventors: Tod Cameron Semple, Woodside, CA (US); Maxwell Chandler Robinson, Burlingame, CA (US)

(73) Assignee: Zoox, Inc., Foster City, CA (US)

( * ) Notice: Subject to any disclaimer, the term of this patent is extended or adjusted under 35 U.S.C. 154(b) by 897 days.

(21) Appl. No.: 18/072,271

(22) Filed: Nov. 30, 2022

(51) Int. Cl.
*G06F 30/20* (2020.01)
*G06T 7/246* (2017.01)
*G07C 5/04* (2006.01)

(52) U.S. Cl.
CPC .............. *G06F 30/20* (2020.01); *G06T 7/246* (2017.01); *G06T 2207/10016* (2013.01); *G06T 2207/10028* (2013.01); *G06T 2207/30252* (2013.01); *G07C 5/04* (2013.01)

(58) Field of Classification Search
CPC ..................... G06F 30/20; G06T 7/246; G06T 2207/10016; G06T 2207/10028; G06T 2207/30252; G07C 5/04
See application file for complete search history.

(56) References Cited

U.S. PATENT DOCUMENTS

| | | | |
|---|---|---|---|
| 12,367,675 B2 * | 7/2025 | Fang ..................... | G06V 20/52 |
| 2021/0370921 A1 * | 12/2021 | Silva ................ | B60W 60/0027 |
| 2022/0299626 A1 * | 9/2022 | Chen ..................... | G01S 13/72 |

* cited by examiner

*Primary Examiner* — Kyle J Kingsland
(74) *Attorney, Agent, or Firm* — Lee & Hayes, P.C.

(57) ABSTRACT

Techniques are described herein for analyzing vehicle log data and determining initial movement times for stationary objects represented in the log data. Various techniques may include receiving log data including a sequence of bounding shapes representing an object detected in a physical environment, and analyzing the sequence of bounding shapes to distinguish actual object movements from noise within the perceived object data and/or errors caused by partially occluded objects. Additional techniques described herein may include executing log-based driving simulations during which simulated agents are controlled based on the initial movement times of corresponding objects in the physical environment. For instance, a simulated agent may be controlled using a trajectory of a corresponding real-world object and/or may be converted to a programmatic agent at a time during the simulation after the initial movement time of the corresponding real-world object.

20 Claims, 6 Drawing Sheets

412

414(A)

416(A)

BOUNDING SHAPE
(TIME = T1) 414

BOUNDING SHAPE
(TIME = T2) 416

416(B)

414(B)

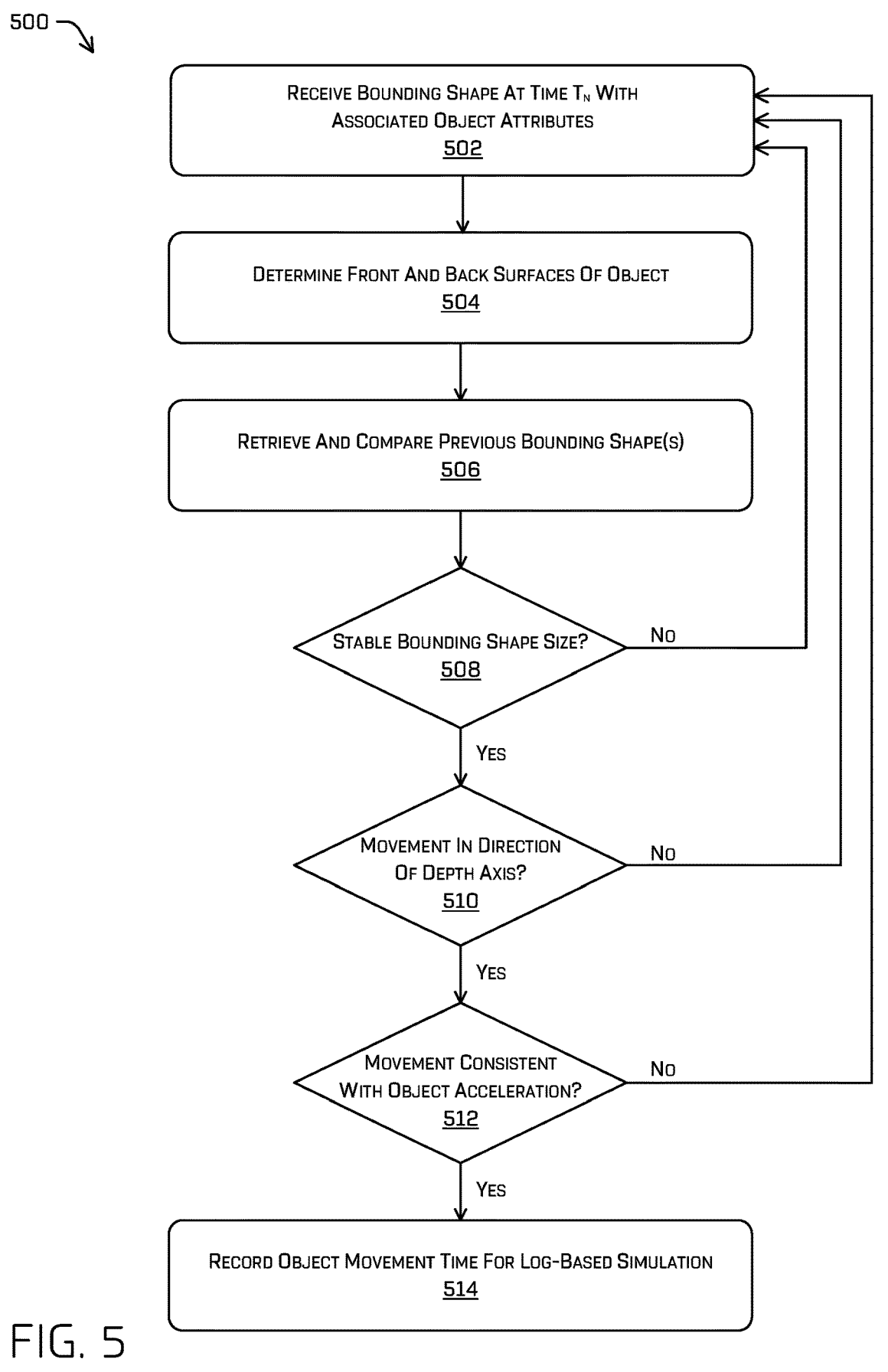

500

RECEIVE BOUNDING SHAPE AT TIME $T_N$ WITH
ASSOCIATED OBJECT ATTRIBUTES
502

DETERMINE FRONT AND BACK SURFACES OF OBJECT
504

RETRIEVE AND COMPARE PREVIOUS BOUNDING SHAPE(S)
506

STABLE BOUNDING SHAPE SIZE?
508

No

YES

MOVEMENT IN DIRECTION
OF DEPTH AXIS?
510

No

YES

MOVEMENT CONSISTENT
WITH OBJECT ACCELERATION?
512

No

YES

RECORD OBJECT MOVEMENT TIME FOR LOG-BASED SIMULATION
514

FIG. 5

CONTROLLING AGENT MOVEMENT IN DRIVING SIMULATIONS BASED ON VEHICLE LOG DATA

BACKGROUND

Simulated data and simulations can be used to test and validate the features and functionalities of systems, including features and functionalities that may be otherwise prohibitive to test in the real world (e.g., due to safety concerns, limitations on time, repeatability, etc.). For example, autonomous vehicles and other moving vehicles may use driving simulations to test and improve passenger safety, vehicle decision-making, sensor data analysis, and route optimization. However, creating simulations that both accurately reflect real-world scenarios and validate functionality of vehicle systems is technically challenging. For instance, driving simulations that accurately reflect real world scenarios may be difficult and expensive to create and execute, as the data used to create such simulations may be noisy, inconsistent, or incomplete. Further, for simulations based on data previously captured by a vehicle operating in the real world, the simulated vehicle may operate differently from the real-world vehicle that captured the data, which can produce position errors and other discrepancies making it difficult to execute accurate and valuable simulations for testing the vehicle systems.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 5 illustrates an example process of analyzing a sequence of bounding shapes associated with an object detected in an environment and determining an initial object movement time, in accordance with one or more examples of the disclosure.

DETAILED DESCRIPTION

Figure 1:
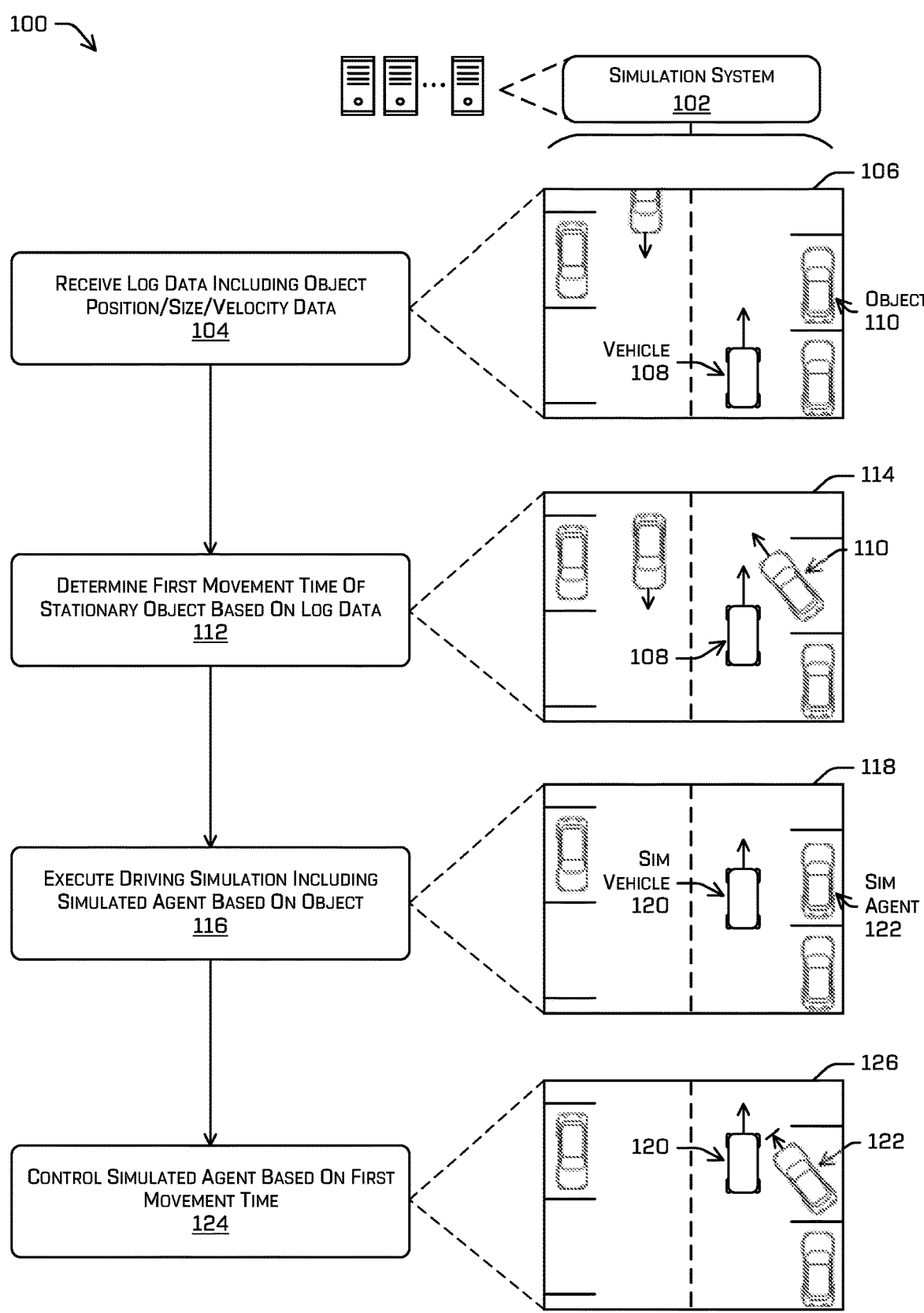
FIG. 1 is a pictorial flow diagram illustrating an example of determining an initial movement time for an object detected in vehicle log data, and controlling a corresponding simulated agent based on the initial movement time of the object, in accordance with one or more examples of the disclosure.

This disclosure relates to analyzing vehicle log data and determining initial movement times when stationary objects represented in the log data first begin to move. After determining initial movement times of real-world objects based on the log data, a simulation system then may execute log-based driving simulations in which simulated agents are controlled based on the initial movement times of their corresponding real-world objects. In various examples, the simulation system may execute driving simulations based on log data captured by a vehicle operating in the real world (e.g., log-based simulations), in which a simulated vehicle is controlled in a simulated environment by a vehicle controller. The simulated environment of a driving simulation also may include any number of additional simulated agents that may interact with or otherwise affect the behavior of the simulated vehicle during the simulation. The additional simulated agents may include "playback agents" that are controlled based on the log data associated with corresponding real-world objects, and/or "smart agents" that are controlled programmatically in the simulation by a planner component. For driving simulations to evaluate the vehicle controller of a simulated vehicle robustly and effectively, the additional simulated agents in the simulation should operate in a realistic manner when performing driving maneuvers and reacting to complex driving situations.

However, operating simulated agents in complex driving simulations can be technically challenging and costly in terms of time and computational resources. For instance, for log-based driving simulations based on log data captured by a vehicle operating in the real world, the simulation system may initially generate and control a number of simulated agents as playback agents. However, in some log-based simulations the simulated vehicle may operate differently from the real-world vehicle that captured the log data. For instance, the simulated vehicle may drive at different velocities, accelerations, and/or steering angles than the real-world vehicle, which can produce position errors and other discrepancies in the simulation. To compensate for these discrepancies, the simulation system may change the behaviors of the simulated playback agents so that they act in a realistic manner responsive to the new behaviors of the simulated vehicle. For instance, based on behavior changes of a simulated vehicle in a log-based simulation (e.g., relative to the real-world vehicle that captured the log data), the simulation system may change the behaviors of the simulated agents including changing movement times, trajectories, and/or converting playback agents to programmatic smart agents at various times during the simulation.

To control a simulated agent in a realistic manner, it may be useful for the simulation system to accurately determine the time when the corresponding real-world object first started moving. For example, for a vehicle that is parked in a parking space, pulled over on the side of a roadway, or stationary at an intersection (e.g., at a stop sign, traffic signal, or crosswalk), the first movement time for the vehicle may refer to the time when the vehicle first begins to accelerate and is no longer stationary in the environment. The simulation system may use the first movement time of a real-world vehicle (or other real-world object) to control a corresponding simulated agent. For example, the first movement time can be used as a start time for the simulated agent to perform a particular driving maneuver or to begin following a trajectory, or as a time for the simulation system to convert the simulated agent from a playback agent to a programmatic smart agent.

However, accurately determining the time when a stationary real-world object represented in the log data first begins to move can be technically challenging and error prone. For example, the log data may include a sequence of closed bounding shapes (e.g., bounding boxes, bounding contours) representing an object as it was detected (or perceived) at different times in the physical environment. The bounding shapes (and/or other object log data) may be based on sensor data captured in the environment using one or more sensor modalities (e.g., cameras, lidar sensors, radar sensors, etc.). However, the sensor data readings and the resulting bounding shapes in the log data may be vulnerable to noisy data, jitter, and other inaccuracies that may cause a stationary object to be perceived as moving. As an example, noisy sensor data may result in a sequence of bounding boxes for an object that appear to thrash back and forth quickly even though the real-world object is not moving. Further, when an object is partially occluded in the environment, the bounding boxes (or other object log data) representing the object can appear to change in size and/or to move based on the occlusion, even when the real-world object is fixed-size and stationary.

To address these challenges, various techniques described herein include receiving and analyzing log data to determine the initial movement times for objects represented in the log data. In some examples, a simulation system may receive log data captured in an environment, including a sequence of bounding shapes (e.g., 2D- or 3D-bounding boxes, bounding contours, etc.) representing an object different times in the environment. The simulation system may analyze the bounding shapes to distinguish actual movements of the real-world object from inaccuracies in the bounding shapes caused by sensor data noise and/or partial occlusions of the object. In some examples, the simulation system may analyze the size, shape, and/or configuration of bounding shapes to determine when the bounding shape has stabilized and is not occluded from the perceptive of the sensors capturing the log data. After determining that the bounding shape has stabilized within the log data, the simulation system may use the orientation (e.g., yaw) and/or object type to determine a front and back surface of the object. Using points on the front surface and back surface of the object, the simulation system may analyze the movements between sequential bounding shapes to distinguish between side-to-side movements (which are likely to be noise) and front-to-back movements (which may represent movement by the actual real-world object). Additionally or alternatively, the simulation system may determine front and back points on the bounding shapes to verify that the front surface of the object is moving in a similar manner (e.g., similar direction and acceleration) as the back surface of the object. Inconsistent movement patterns between the front and back surfaces of a bounding shape may indicate noisy sensor data and/or an occlusion, whereas consistent movement patterns between the front and back surfaces is more likely to indicate movement by the real-world object. The simulation system may use these techniques and other techniques described herein to determine, based on the received log data, the time when a stationary object in the environment first begins to move.

After determining the first movement time for a real-world object in the environment, the simulation system may use the first movement time to control an associated simulated agent in a driving simulation. For instance, the simulation system may use the first movement time of a real-world object to initiate a driving maneuver or to begin following a trajectory for an associated simulated agent in the simulation. Additionally or alternatively, the simulation system may use the first movement time of a real-world object to determine when the associated simulated agent can be converted from a playback agent to a smart agent in the simulation.

As described in more detail below, the techniques described herein provide improvements and technical advantages for generating and executing driving simulations. By providing driving simulations that include more realistic simulated agents, the driving simulations themselves may represent real-world driving scenarios more accurately and may be more valuable for evaluating the performance of autonomous vehicle controllers. Additionally, converting simulated agents from playback agents to smart agents using programmatic planner components may allow the simulated agents to respond dynamically to changes in the simulation in a realistic manner, making the driving simulations described herein more robust and more durable when the behaviors of the simulated vehicle controllers change. Because the techniques described herein provide more realistic and responsive simulated agents, the driving simulations using these simulated agents may operate over longer periods of time with fewer failures, and less need for intervention and manual analysis, thereby increasing the number of usable simulation test and improving the efficiency and quality of the simulation system.

The techniques described herein may be implemented in a number of ways. Example implementations are provided below with reference to the following figures. Although certain examples are discussed in the context of autonomous vehicles and log-based driving simulations, in other examples, the methods, devices, systems, computer-readable media, and/or other implementations described herein may be applied to a variety of other environments, such as utilization in semi-autonomous or non-autonomous vehicles, and/or within aviation or nautical contexts.

FIG. 1 depicts an example process 100 of determining an initial movement time for a real-world object represented in vehicle log data, and then executing a log-based simulation including controlling a corresponding simulated agent based on the initial movement time of the object. As described in this example, some or all of the operations in process 100 may performed by a simulation system 102. The simulation system 102 may include, for instance, a driving simulation system, virtual driving simulator or other type of simulation system, and/or sensor engines configured to generate and provide sensor input data to simulation systems. Process 100, and various other examples herein, are described in reference to driving simulations during which a simulated vehicle is controlled in a simulated environment by one or more vehicle controllers. During a simulation, the simulation system 102 provides the simulated vehicle sensors with sensor input data representing the simulated environment and the simulated objects therein, and the simulated vehicle responds to the sensor input data by controlling the vehicle. However, it can be understood from the context of this disclosure that techniques described herein are not limited to driving simulation systems, and may be implemented in a similar or identical manner within other systems, including but not limited to video gaming systems, virtual reality systems, non-driving simulation systems (e.g., flight simulators, nautical navigation simulators, space navigation simulators, etc.), and/or image/sensor data processing systems operating in physical (e.g., non-simulated) environments.

At operation 104, the simulation system 102 may receive log data representing one or more real-world objects in a physical environment. The log data received in operation 104 may include, for example, object size data, position data, velocity data, yaw (or orientation), object type data, and/or various other attributes associated with an object detected in the environment. In some examples, the log data may include driving log data captured by a vehicle operating in a real (e.g., non-simulated) physical environment or log data generated from a different simulation. For instance, as shown in box 106, the log data may include data captured by a real vehicle 108 traversing a physical environment. In this example, the vehicle 108 can include one or more sensors, including but not limited to, one or more time-of-flight sensors, lidar sensors, radar sensors, sonar sensors, image sensors, audio sensors, infrared sensors, location sensors, wheel encoders, IMUs, etc., or any combination thereof, although other types of sensors are contemplated. As the vehicle 108 traverses through the environment, the various sensors can detect and capture sensor data associated with any number of additional objects in the environment, including other vehicles (e.g., object 110), bicycles, pedestrians, and any other static or dynamic objects in the environment.

In some examples, the log data received in operation 104 may include bounding boxes and/or other bounding shapes representing the various objects detected in the environment. For example, a perception component of the vehicle 108 (or other sensor-based system configured to generate the log data) may use one or a combination of image data, lidar data, radar data time-of-flight data, and/or various other sensor data to determine a bounding box for an object perceived within the environment. For a particular object perceived by the sensors of the vehicle 108, the log data received in operation 104 may include a two-dimensional or three-dimensional bounding box (e.g., a rectangular box) representing the object and substantially encompassing all of the surfaces of the object. Example techniques for determining a bounding boxes based on sensor data are discussed in U.S. patent application Ser. No. 15/814,870 titled "Pose Determination from Contact Points" and filed Nov. 16, 2017, and U.S. patent application Ser. No. 16/408,414 titled "Image-Based Depth Data and Bounding Boxes" and filed May 9, 2019, the entirety of both of which are herein incorporated by reference, for all purposes.

In some examples, the log data may include other types of bounding shapes instead of or in addition to bounding boxes. For instance, 2D or 3D bounding boxes are generally rectangular or cuboid shapes which are expanded in size to include all of the portions of the object. As a result, a 2D or 3D bounding box might not accurately represent the size and shape of certain objects. Therefore, in some cases the log data may include other bounding shapes and/or bounding contours represented as 2D or 3D polygons that may have any number of sides. In such examples, a bounding shape may be determined based on the various sensor data (e.g., lidar data, image data, radar data, etc.) to closely follow the outer edges of the object, regardless of the object's shape or irregularities. In some cases, a bounding shape may be a relatively tight-fitting polygon to provide a more accurate representation of the object's shape than a rectangular bounding box. In one or more examples, bounding shapes may be polygons having five or more outer edges (e.g., five or more edges in a head-on view and/or in a top-down view), which may be referred to as "boundary edges." Example techniques for determining additional types of bounding shapes and bounding contours are discussed in U.S. patent application Ser. No. 17/138,710, titled "Collision Avoidance Using An Object Contour," and filed Dec. 30, 2020, the entirety of which is herein incorporated by reference for all purposes.

Although various examples described herein include analyzing and comparing bounding boxes and/or bounding shapes representing an object to determine the initial movement time of the object, in other examples the log data representing objects need not include or need not be limited to bounding boxes or bounding shapes. For instance, log data received in operation 104 may including, additionally or alternatively, images, point cloud data (e.g., a lidar point cloud and/or a radar point cloud), radar return signals, etc., representing the size, shape, and position of an object in the environment. In various examples, the representation of an object within the log data over a period of time may include various types of object data including, but not limited to, bounding boxes, non-rectangular bounding shapes, point clouds, and/or other object representation including at least a perceived position of the object in the environment at least one extent value (e.g., a length or object size in at least one dimension).

In some examples, the object log data received in operation 104 may include various other attributes associated with a perceived object, such as the velocity, acceleration, yaw, object type/classification, and other attributes of a perceived object based on the sensor data captured for the object. For example, object data within the log data may include an object class, for instance, a four-wheeled object (e.g., car, truck, etc.), two-wheeled object (e.g., bicycle, etc.), pedestrian, etc., and/or an object sub-class (e.g., sedan, bus, petty cab, streetcar, electric bicycle, articulated vehicle, train, etc.). The object classification/type, and the yaw of the object (which also may be referred to as the orientation or direction of the object) may be determined by processing the sensor data using one or more machine-learned models configured to perform object detection/recognition/classification based in image data and/or lidar data, etc. When the log data includes bounding boxes and/or other bounding shapes representing objects, each bounding box or shape may include additional object data (e.g., velocity, acceleration, yaw, object type, etc.), which may be stored as attributes or flags associated with the bounding box or shape. In some examples, the log data may include confidence values associated with a bounding shape and/or any of the additional attributes for a perceived object.

Additionally, for each object 110 detected in the environment, the log data may include a bounding shape (or other object representation) along with the additional object attributes (e.g., classification, size, shape, position, velocity, acceleration, yaw, etc.) at periodic time intervals (e.g., every 0.1 second, every 0.05 seconds, every second, etc.). The length of the time intervals may depend on the system used to capture the log data (e.g., vehicle 108), the particular sensors, and/or the environment. For instance, the vehicle 108 may perceive the object 110 at multiple different times, such as each processing/output cycle of a sensor system or perception component, during a time period when the object 110 is near the vehicle 108 and within the detection range of the vehicle's sensors. Accordingly, for each object 110 perceived in the environment, the log data may include a sequence of bounding shapes (or other object representations), and associated object attributes, representing the object 110 a sequence of time points when the object 110 was within the perception range of the vehicle 108.

At operation 112, the simulation system 102 may analyze the log data received in operation 104 to determine first movement time for an object detected in the environment. The first movement time (or initial movement time) for an object refers to the time when the object begins accelerating and is no longer stationary in the environment. For example, a first movement time for an object 110 may refer to the time when the object first begins to pull out of a parking space, or pull back onto the road after a curbside stop, or begins moving after stopping at a stop sign, traffic light, crosswalk, etc. For example, box 114 depicts the same environment shown in box 106, at a subsequent time when the object 110 has begun to pull out of a parking space and into traffic in front of the vehicle 108.

In various examples, the simulation system 102 may determine a first movement time for an object by comparing the log data representing the object at two or more different time points in the log data. For instance, when the log data includes bounding shapes (e.g., bounding boxes) representing objects in the environment, the simulation system 102 may compare a sequence of two or more bounding shapes representing an object at different time points to determine the first movement time for the object. However, as noted above, in many cases the first movement time for an object cannot be reliably determined simply based on observing changes in the size, shape, or position of a bounding shape over time, or by relying on the velocity or acceleration attributes associated with the bounding shapes in the log data. For various reasons, including that the sensor data used to generate the bounding shapes in the log data may be noisy, inconsistent, and/or incomplete, or that a perception component used to generate a bounding shape may not accurately account for some objects, etc., the resulting bounding shapes for an object 110 may appear to change in size or position even when the corresponding object is stationary. Therefore, in operation 112, the simulation system 102 may apply a number of different techniques and algorithms, described in more detail below, to determine more accurately the first movement time for one or more objects in the log data.

In some examples, the simulation system 102 may compare multiple bounding shapes in a sequence of bounding shapes (or other object data) representing an object 110 at different points in time, to determine when the size of the bounding shape for an object 110 stabilizes within the log data. As described below in more detail, when the size of a bounding shape for an object 110 changes at different times in the log data, this may indicate that the object 110 is occluded by additional objects obstructing the sensor view of the object 110. Additionally or alternatively, the size of a bounding shape changing in the log data may indicate that the sensors capturing the data (sensors on vehicle 108) are too far from the object 110 to obtain consistent and accurate bounding shapes. Accordingly, in some cases, the simulation system 102 may determine an initial time within the size of the bounding shape for an object 110 stabilizes within the log data, before determining the first movement time for the object 110. In such cases, the object 110 may be considered to be stationary by the simulation system 102 until first determining that the size of the bounding shape for the object 110 has stabilized between multiple bounding shapes associated with different times in the log data.

To determine when the size of the bounding shape for the object 110 has stabilized, the simulation system 102 may use one or more size thresholds (e.g., separate length, width, and height size thresholds) to compare multiple bounding shapes associated with the same object 110 at a consecutive sequence of time points in the log data. In some cases, the size of a 2D bounding shape representing the object 110 from the perspective of the vehicle 108 may change as the vehicle 108 moves relative to the object 110. In such cases, the simulation system 102 may compensate for the perspective angle of the vehicle 108 by using 3D bounding shapes rendered in a 3D environment and/or by adjusting the size dimensions of the bounding shapes based on the yaw of the object 110 and the angle of the vehicle 108 relative to the object.

Although the above examples describe determining when the size of the bounding shape representing an object 110 has stabilized in the log data, in other examples the simulation system 102 may use similar or identical techniques to determine when the shape of the bounding shape (e.g., using thresholds for magnitudes of sides, angles, curves, etc.) has stabilized and/or when the yaw of the bounding shape (e.g., the determined heading or orientation of the object 110) has stabilized. In various examples, the simulation system 102 may use the stabilization of size, shape, and/or yaw, individually or in any combination, as a precondition to determining whether the object 110 is moving or stationary. In other examples, the simulation system 102 may determine an object is moving when at least one surface of the object (e.g., a front surface or back surface) can be identified with sufficient confidence and the identified surface(s) can be determined to be moving. Thus, in these examples, the simulation system 102 may determine an initial movement time for an object even when a portion of the object is occluded and/or when the bounding shapes representing the object 110 in the log data have not yet stabilized with respect to size or shape, etc.

In some examples, determining an initial movement time for an object 110 represented in the log data also may include determining front and back surfaces of the object 110 and/or specific points on the front and back surfaces. To determine the front and back surfaces of the object 110, the simulation system 102 may use the object type (and/or classification) and/or the yaw (or orientation) of the object 110 as included in the log data. Additionally or alternatively, the log data may include the results of machine-learned models and/or other techniques performing object detection, recognition, and/or classification, based on image data, lidar data, and/or other sensor data. Such models can detect and label within the log data specific patterns (e.g., license plates, side view mirrors, headlights, taillights, wheels, windows, etc.) that may be associated the front, rear, or side surfaces of a car, truck, motorcycle, bicycle, etc. In such cases, the simulation system 102 may use the additional attribute data and/or labels in the log data to determine the object orientation and the front and/or rear surfaces of the object 110. In some examples, when the various object attributes and/or labels described herein (e.g., object type, orientation, object feature labels, surface labels, etc.) are not included in the log data received in operation 104, the simulation system 102 alternatively may include components (e.g., machine-learned models) configured to determine any of the object attributes and/or features based on the sensor data included in the log data.

When the simulation system 102 is able to determine the front and back surfaces of the object 110 with a sufficient amount of confidence, it also may determine representative points (e.g., a front point on a back point) on the front and back surfaces which can be used to determine movement of those respective surfaces. In some cases, the simulation system 102 may determine a front point as the center point of the front surface, or alternatively as the center point of the intersection between the front surface and the ground. Similarly, a back point may be determined as the center point of the back surface, or as the center point of the intersection between the back surface and the ground.

After the simulation system 102 has determined front and back points (and/or front and back surfaces) for bounding shape representing an object 110 in the log data, it may use the front and back points and/or surfaces to determine consistent movement of the object along its depth axis (which also may be referred to as a front-back or back-front axis). For example, the simulation system 102 may determine the dot product of the movement (e.g., frame-to-frame movement in the log data) of the front point of the object with the depth axis of the object, and/or the dot product of the movement of the back point of the object with the depth axis of the object. These computations may be used to determine a value representing the movement of the object 110 in the forward or backward direction. In contrast to techniques using the frame-to-frame Euclidean distance between successive front points in the log data and/or between successive back points in the log data, computing the dot product with the depth axis may exclude any movement of the object 110 in the side-to-side direction which is likely caused by noise.

In some examples, the simulation system 102 also may use the front and back points to verify that the front surface of the object 110 is moving in a manner consistently with the back surface of the object 110. As an example, when the log data indicates that front and back surfaces of the bounding shapes are moving in different directions and/or at significantly different speeds in the forward/backward direction, this likely represents noisy log data rather than actual movement by the object 110.

Additionally or alternatively, the simulation system 102 may distinguish consistent object movement from noise/jitter by tracking and aggregating the determined movement of the bounding shape representing the object 110, in the forwards or backwards direction, over a sequence of multiple successive (e.g., three or more) bounding shapes in the log data. For example, the simulation system 102 may aggregate the total amount of object movement detected in the forward/backward direction over a period of time based on a sequence of three or more bounding shapes representing the period of the time in the log data. This amount may be referred to as "arc length" and may represent the sum of the distances moved by the object 110 in each direction during the time period. The simulation system 102 may compare the arc length value calculated for the object 110 to the "progress" amount representing only the distance in the forward/backward direction between the first bounding shape and the last bounding shape of the time period. By comparing the total arc length traveled by the perceived object 110 to the progress made by the perceived object 110 in a direction of travel, the simulation system 102 may determine whether the perceived movement of the object 110 is likely caused by jitter or by actual movement of the object 110. For instance, the simulation system 102 may compare a ratio of the arc length traveled by a bounding shape to the progress made by the bounding shape during a period of time to a threshold, where an arc length-to-progress ratio exceeding the threshold is likely to indicate sensor data jitter, and an arc length-to-progress ratio less than the threshold is likely to indicate actual movement of the object 110.

Further, in some examples, the simulation system 102 also may compare the perceived rate of acceleration of the object 110 to an expected range of accelerations based on the object classification/type, driving environment, etc. For example, if a bounding shape in the log data represents a vehicle in the environment (e.g., object 110), the simulation system 102 may assume that the motion based on its acceleration may generally follow the equation $$d = \frac{1}{2}at^2 + vt + c$$

over relatively short time periods, based on the acceleration or braking commands performed by the vehicle. Therefore, in some examples, the simulation system 102 may compare the perceived acceleration of the bounding shape in the log data to the expected acceleration of the object 110, to determine whether or not the perceived object movement is consistent with the expected movement capabilities of the object. In some examples, the similar or identical comparisons may be performed in the side-to-side direction, and different ranges of expected movement capabilities of the object 110 in the front-to-back and side-to-side directions are determined for different object classifications (e.g., vehicles, bicycles, pedestrians, etc.).

In operation 112, to determine the first movement time of the object 110 based on the log data, the simulation system 102 may use any of these techniques individually and/or in combination. For instance, in some examples the simulation system 102 may perform an algorithm that traverse the log data, frame-by-frame for a bounding shape, to determine a time when the size of the bounding shape has stabilized, both the front and back surfaces of the bounding shape are moving in the same direction at that time, that no significant side-to-side movement bounding shape is occurring, and that the bounding shape is moving at a forward/backward rate that is consistent with the expected movement capabilities of the object 110. After verifying that each of criteria is individually satisfied for the particular time (e.g., using the specific tests and/or thresholds associated with each criteria) the simulation system 102 may determine the time as a likely first movement time for the object 110 in the physical environment. In other examples, the simulation system 102 may use any combination of these criteria, and/or may weight any or all of the criteria, to provide a most likely determination for any point in the time in the log data, as to whether the movement of the bounding shapes at that time in the log data was caused by noise or by the actual movement by the associated object 110.

At operation 116, the simulation system 102 may execute a driving simulation including a simulated vehicle operating in a simulated environment. As described above, driving simulations can be used to test and validate the features and functionalities of vehicle control systems, to improve passenger safety and comfort, vehicle decision-making, sensor data analysis, route optimization, and the like. As shown in box 118, during the driving simulation, a simulated vehicle 120 may be controlled by one or more vehicle control systems (or vehicle controllers) to traverse the simulated environment including one or more additional simulated agents (e.g., simulated agent 122) and other simulated objects.

In this example, the driving simulation may be a log-based simulation in which some or all of the simulated environment and/or simulated agents are based on the corresponding driving environment and object represented in the log data received in operation 104. As described above, the simulated agents in log-based simulations may be controlled based on the movements of their corresponding real-world objects. In this example, the simulated agent 122 may be represented and controlled during the driving simulation based on the log data associated with the object 110. For instance, the simulation system 102 may generate log-based simulations utilizing techniques such as those described in U.S. patent application Ser. No. 16/376,842, filed Apr. 5, 2019 and entitled "Simulating Autonomous Driving Using Map Data and Driving Data," U.S. patent application Ser. No. 16/555,988, filed Aug. 29, 2019 and entitled "Vehicle Controller Simulations," U.S. patent application Ser. No. 17/184,128, filed Feb. 24, 2021 and entitled "Agent Conversions in Driving Simulations," U.S. patent application Ser. No. 17/184,169, filed Feb. 24, 2021 and entitled "Simulating Agents based on Driving Log Data," the entire contents of which are incorporated herein by reference for all purposes.

In general, performing driving simulations based on many different and diverse driving scenarios (or driving situations) can provide the most effective testing and validation of the vehicle control systems. Driving scenarios may correspond to time periods in a simulation during which the simulated vehicle 120 that is being evaluated encounters and traverses a particular driving scene or situation, and/or when other simulated agents encounter and traverse a particular driving scene or situation in the simulation. The driving simulation executed in operation 116 may be a log-based simulation based on the same driving scenario encountered by the vehicle 108 in its physical environment and recorded in its log data. The simulated environment and/or simulated agents may be configured to replicate the corresponding physical environment and/or agents, including static objects (e.g., buildings, bridges, signs, curbs, sidewalks, etc.) as well as dynamic agents such as other simulated vehicles (e.g., simulated agent 122 and other simulated cars, trucks, trains, etc.), simulated pedestrians, simulated bicyclists, etc. During the driving simulation, the simulation system 102 may use a vehicle controller to control the simulated vehicle 120, and may evaluate the performance of the vehicle controller(s) based on the actions of the simulated vehicle 120 during the simulation.

At operation 124, the simulation system 102 may control the simulated agent 122 during the driving simulation based at least in part on the first movement time determined for the object 110 in operation 112. In some examples, the driving simulation may be configured to control the simulated agent 122 as a playback agent that is configured to follow a predetermined trajectory and/or to perform a predetermined driving maneuver at a particular time during the simulation. In such examples, the simulation system 102 may use the first movement time determined for the object 110 to determine the starting time for the simulated agent 122 to change from a stationary agent to a dynamic agent and to begin to perform its playback trajectory and/or maneuver. Similar or identical techniques can be used for other types of simulated agents (e.g., bicycles, pedestrians, etc.).

In some examples, the simulation system 102 may control the simulated agent 122 as a playback agent starting at a time corresponding to the first movement time determined for the object 110 in operation 112. For instance, if the first movement time determined in operation 112 for the object 110 is N.N seconds after a time point in the log data matching the start of the driving simulation scenario, then the simulation system 102 may begin moving the simulated agent 122 at the N.N second time in the driving simulation. However, as discussed above, the simulated vehicle 120 may move at a different velocity and/or trajectory than the vehicle 108 that captured the log data, which can cause errors and discrepancies in the positions of objects in the simulation. Therefore, in some examples, the simulation system 102 may adjust the time that it begins moving the simulated agent 122 to perform a playback trajectory or maneuver, based on the difference in the position and/or velocity of the simulated vehicle 120 relative to the position of the stationary simulated agent 122.

Additionally or alternatively, the simulation system 102 may use the first movement time determined for the object 110 in operation 112 to determine a first time when, during the driving simulation, the simulated agent 122 may be converted from a playback agent to a programmatic smart agent. As discussed above, a simulated agent operating as a playback agent in a driving simulation may be controlled to behave similarly or identically to a corresponding object represented in the log data. However, when a simulated agent has been converted from a playback agent to a smart agent, the simulation system 102 may control the behaviors and driving decisions of the simulated agent using one or more programmatic planner components (e.g., heuristic-based and/or machine learning-based). In some examples, the planner component used to control a simulated smart agents may be different than the planner component used to the real-world vehicle that captured the log data. For instance, the simulation system may use planner components for controlling smart agents are smaller (e.g., in terms of computing resources) and simpler (e.g., in terms of navigation logic) in order to provide improved scalability and to be more resource efficient when executing simulations. Additional techniques and examples for converting playback agents to smart agents in driving simulations can be found, for example, in U.S. patent application Ser. No. 17/184,128, titled "Agent Conversions In Driving Simulations," and filed Feb. 24, 2021, the entirety of which is herein incorporated by reference for all purposes.

As noted above, in some instances the simulation system 102 may use the first movement time determined for the object 110, to determine the first time at which the corresponding simulated agent 122 may be converted to a smart agent. During the simulation, prior to that point in time, the simulation system 102 may control the simulated agent 122 as stationary (e.g., as a static object), and thus the simulated agent 122 would not be capable of using a planner to determine and follow a trajectory or perform a driving maneuver. However, after the time in the simulation that corresponds to the first movement time for the object 110, the simulation system 102 may execute a routine during the simulation to determine if and when the simulated agent 122 should be converted from a playback agent to a smart agent. For instance, as described in U.S. patent application Ser. No. 17/184,128, discussed above and incorporated by reference herein, the simulation system 102 may convert a simulated agent 122 from a playback agent a smart agent based on a determination that the playback agent would potentially collide (or otherwise interact) with the simulated vehicle 120 or another object in the simulation.

For instance, as shown in box 126, the simulation system 102 in this example has converted the simulated agent 122 to a smart agent to avoid a potential collision with the simulated vehicle 120. In this example, the simulation system 102 may first determine that the current simulation time has reached (or passed) the corresponding first movement time for the object 110. When that time is reached during the simulation, the simulation system 102 may initial begin to control the movement of the simulated agent 122 as playback agent, performing the same driving maneuvers performed by the object 110 in the log data. However, when the simulation system 102 detects that the simulated agent 122 may collide with the simulated vehicle 120 (e.g., due to simulated vehicle 120 driving faster than the real vehicle 108), then the simulation system 102 may convert the simulated agent 122 to a smart agent. As a smart agent, the planner component for the simulated agent 122 may detect the potential collision and may brake to allow the simulated vehicle 120 to proceed before continuing to perform its driving maneuver.

Figure 2:
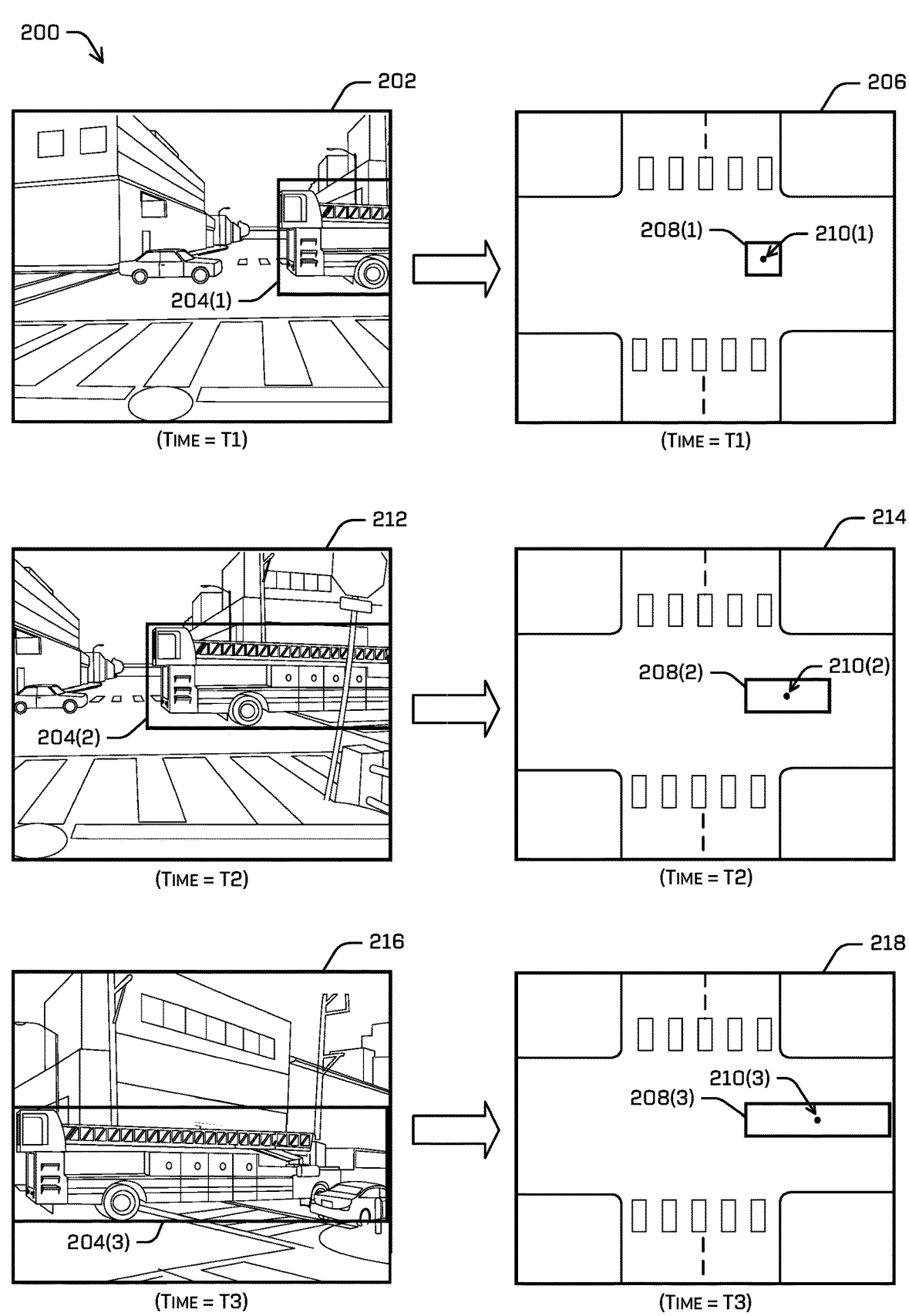
FIG. 2 depicts an example sequence of images of a stationary object detected in log data of a physical environment, and a corresponding sequence of bounding shapes representing the object, in accordance with one or more examples of the disclosure.

FIG. 2 shows an example sequence of images 200 representing a driving environment perceived by a vehicle (or other sensor system) over a period of time. In this example, the sequence of images 200 includes visual renderings (e.g., image data) from the perspective of the vehicle that captured the images at three different times, and corresponding top-down representations of the same driving environment at the same three times. Bounding shapes (e.g., bounding boxes) representing a vehicle (e.g., a firetruck) are rendered in both the perspective view images and the top-down representations of the environment. In various examples, the log data received by the simulation system 102 in operation 104 may include the perspective view data (e.g., image data, lidar data, radar data, etc.) and/or top-down representations of the driving environment, either or both of which may include bounding shapes. Additionally, although various other objects may be present in this example driving environment, including static objects and additional agents, for clarity the images 200 include only the bounding boxes representing the firetruck at the three different times in the driving scene.

In box 202, the vehicle capturing the sensor data is approaching an intersection at a first time (t1) in the driving scene, including a stationary firetruck occupying a cross-traffic driving lane. In this example, the sensors and/or perception components of the vehicle have determined a bounding box 204(1) representing the firetruck. In box 206, a corresponding bounding box 208(1) is shown representing the firetruck in the top-down view of the environment, indicating a center point 210(1) for the firetruck in the x-y plane.

As shown in this example, because the firetruck is partially occluded from the sensors capturing the data in box 202, the bounding boxes 204(1) and 208(1) representing the firetruck do not capture the complete object. Partial occlusions of perceived objects may be caused, for example, by other objects in the environment obstructing the view of the sensors from the perceived object, foreign materials (e.g., dirt, mud, snow, etc.) on the surface of the sensors, and/or the limits of the field-of-view of the sensors.

In box 212 and box 214, the same driving scene is shown at a second time (t2) as the vehicle continues to approach the intersection. In this example, based on the new position of the vehicle capturing the sensor data and/or the movement of occluding objects, the sensors of the vehicle are able to perceive a larger portion of the stationary firetruck. As a result, the bounding box 204(2) representing the firetruck in box 212, and the bounding box 208(2) representing the firetruck in box 214, are larger than bounding boxes 204(1) and 208(1), even though the corresponding object (e.g., the firetruck) has not moved or changed in size.

Similarly, in box 216 and box 218, the same driving scene is shown at a third time (t3) as the vehicle continues to approach the intersection. In this example, based on the new position of the vehicle and/or the movement of occluding objects, the sensors of the vehicle are able to perceive the entire stationary firetruck. As a result, the bounding box 204(3) representing the firetruck in box 216, and the bounding box 208(3) representing the firetruck in box 214, are larger than bounding boxes 204(2) and 208(2), even though the firetrucks still has not moved or changed in size.

As this example illustrates, even when a real-world object perceived by a sensor system does not move or change size, the sensor data (e.g., log data) representing the object can cause the perceived object to appear to change size and move within the environment. For instance, the bounding box 208 representing the firetruck is shown as growing in length from time t1 to time t3, and the centroid 210 (e.g., the center point of the perceived object in the x-y plane) is shown as moving in the left-to-right direction through the intersection. However, by using the various techniques described herein for determining the first movement time of a perceived object (e.g., the firetruck), the partially occlusion of the object shown in this example and/or sensor noise data can be distinguished from actual movements of the object in the physical environment.

Figure 3:
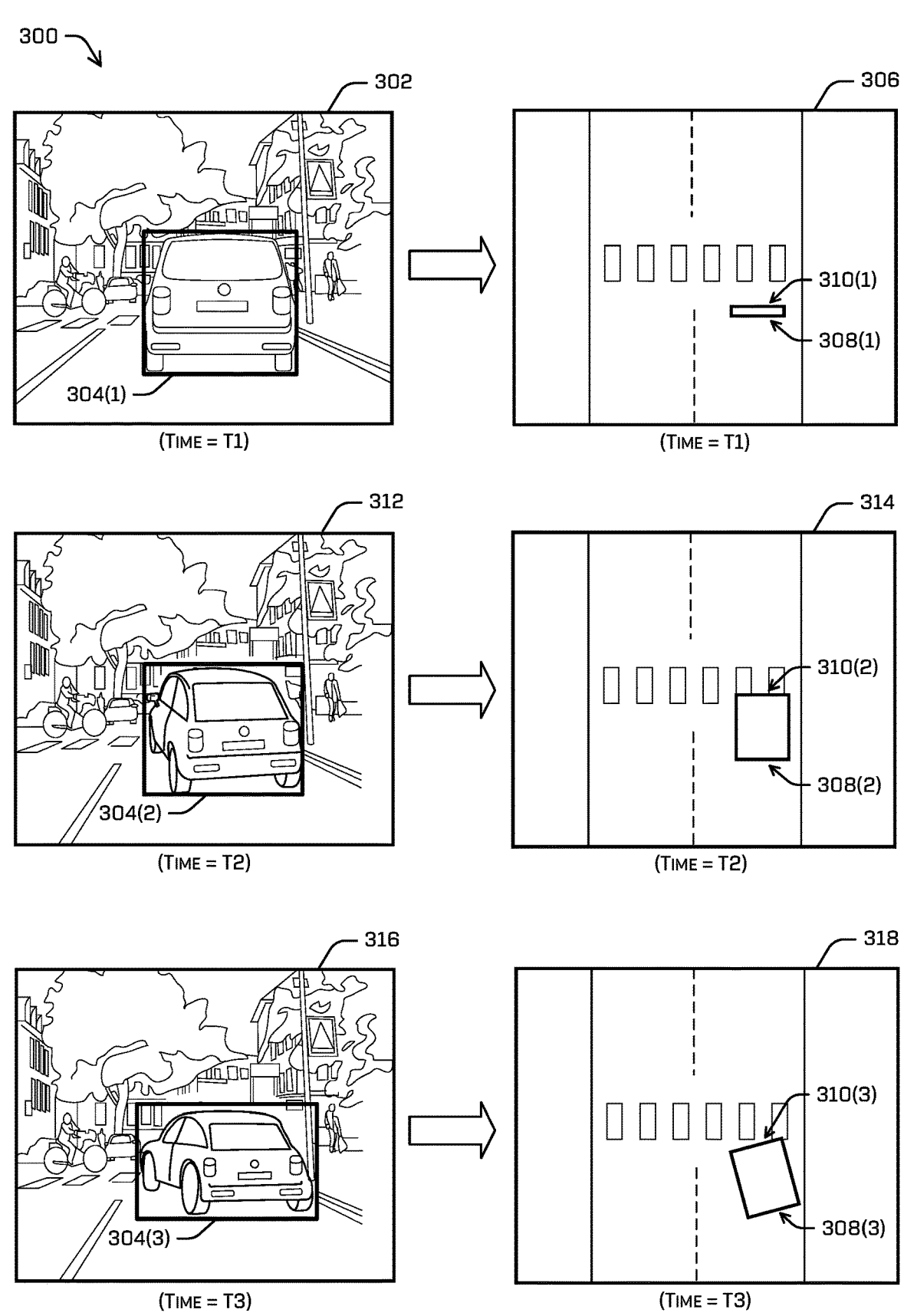
FIG. 3 depicts example sequence of images of a moving object detected in log data of a physical environment, and a corresponding sequence of bounding shapes representing the object, in accordance with one or more examples of the disclosure.

FIG. 3 shows another example sequence of images 300 representing a driving environment perceived by a vehicle (or other sensor system) over a period of time. In this example, the sequence of images 300 include visual renderings (e.g., image data) from the perspective of the vehicle that captured the images at three different times, and corresponding top-down representations of the same driving environment at the same three times. As in the previous example, bounding shapes (e.g., bounding boxes) representing a vehicle (e.g., a car) are rendered in both the perspective view images and the top-down representations of the environment.

In box 302, the vehicle capturing the sensor data is stopped behind another vehicle (e.g., a compact car) that is stopped at a crosswalk at a first time (t1) in the driving scene. In this example, the sensors and/or perception components of the vehicle have determined a bounding box 304(1) representing the car directly in front of the vehicle. However, because the vehicle capturing the sensor data is positioned directly behind the car, it cannot perceive either of the sides or front surface of the car and thus cannot determine the length of the car at time (t1). As a result, the corresponding bounding box 308(1) is shown without a length dimension in this example, although in other examples the bounding box 308(1) may be rendered with an estimated length based on the object type (e.g., compact car). In other examples, when an object is too far away from the vehicle capturing the sensor data, the sensors and/or perception components of the vehicle may be able to accurately perceive the closer surfaces of the object but may be unable to accurately perceive the surfaces of the object that are further away. In such examples, which may include when the vehicle approaching a parallel-parked or diagonally parked car from a distance, the object data and/or bounding shape determined for the object (e.g., bounding box 308(1)) might not accurately represent the extent of the object when it is first perceived.

In box 312 and box 314, the same driving scene is shown at a second time (t2). In this example, the vehicle capturing the sensor data has moved slightly to the side of the stationary car, allowing to perceive the left side of the car and determine the length of car. In this example, the vehicle has determined an updated bounding box 304(2) representing the stationary car at time (t2), and the corresponding bounding box 308(2) is rendered in the top-down representation shown in box 314. In this case, because the complete extent of the car (e.g., multiple surfaces) can be perceived by the vehicle at time (t2), the size of the bounding boxes 304(2) and 308(2) represents the accurate size of the car.

In box 316 and box 318, the same driving scene is shown at a third time (t3). In this example, the car that was previously stopped at the crosswalk has begun to move in reverse toward the vehicle capturing the sensor data. As shown in this example, because the vehicle could perceive complete extent of the car at both time (t2) and time (t3), the size of the bounding boxes 304(2) and 304(3), as well as 308(2) and 308(3) represent the accurate size of the car. Additionally, the simulation system 102 may determine at time (t3) that the perceived size of the vehicle is stable within the log data, indicating that the simulation system 102 can determine accurately whether or not the car is moving. As described above, the vehicle at time (t3) can determine the front and back surfaces of the car (e.g., a front point on the front surface and a back point on the back surface) based on the bounding boxes 304(3) and 308(3). The simulation system 102 then can evaluate the movement of the front and back points/surfaces to determine whether the perceived movement of the bounding boxes is the result of sensor/perception noise, or the result of actual movement by the car in the real-world. In this example, the simulation system 102 may use any combination of the techniques described herein (e.g., verifying consistent movement between the front point and the back point, determining the absence of side-to-side jitter, comparing the arc length to the progress in the forward/backward movement of the bounding boxes over a sequence of multiple bounding shapes, comparing the forward/backward movement to the expected movement of a vehicle, etc.).

Figure 4A:
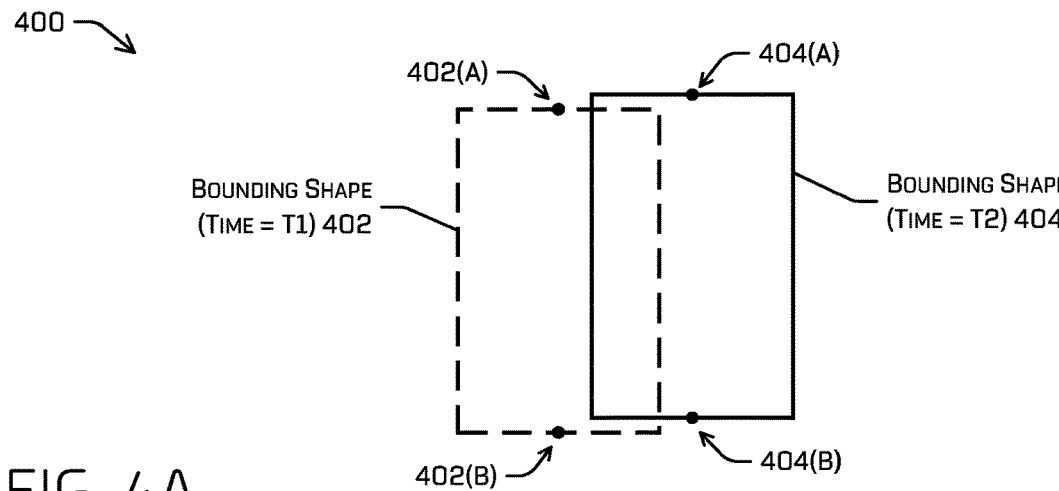
FIGS. 4A to 4C depict examples of sequences of bounding shapes associated with an object detected in an environment, in accordance with one or more examples of the disclosure.
Figure 4B:
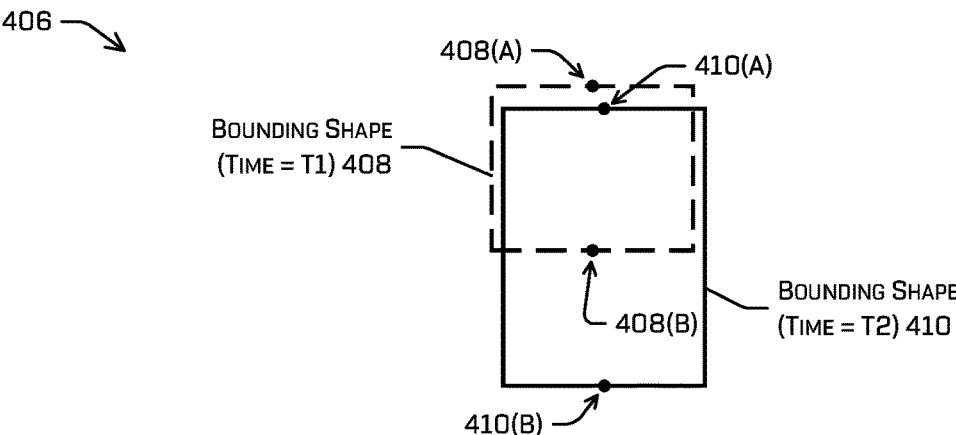
Figure 4C:
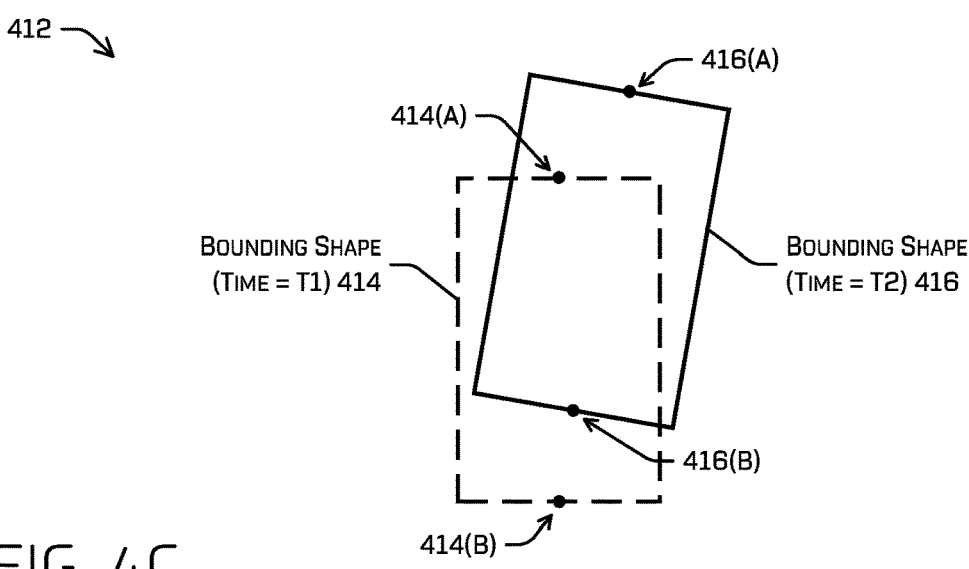

FIGS. 4A to 4C show three examples of sequences of bounding shapes associated with a perceived object in an environment. In each of the examples shown in FIGS. 4A to 4C, two different bounding shapes are shown representing an object perceived in an environment at two different (and sequential times) in the log data. As described below, in each case the simulation system 102 may determine a front point and a back point for each bounding shape, and then may independently analyze the movement of the front point and the back point to determine whether the bounding shape is size stabilized and to determine whether the perceived movement between the bounding shapes is likely to be caused by sensor noise or by actual movement of the object in the physical environment. Additionally, although only two bounding shapes are shown in each of the examples in FIGS. 4A to 4C, in other examples, the simulation system 102 may perform similar or identical analyses for any number of sequential bounding shapes representing an object in the log data In FIG. 4A, diagram 400 shows two different bounding shapes representing an object in a physical environment. The first bounding shape 402 represents the object at a first time (t1), and the second bounding shape 402 represents the same object at a second time (t2). In this example, the simulation system 102 may determine a front point 402(A) and a back point 402(B) on the first bounding shape 402, and similarly may determine a front point 404(A) and a back point 404(B) on the second bounding shape 404. The simulation system 102 then may analyze the movement of the front point and the movement of the back point between time (t1) and time (t2), to determine the likely cause of the perceived movement of the bounding shapes representing the object. As shown in this example, the simulation system 102 may determine only a small amount of movement along the depth axis between time (t1) and (t2), and a larger amount of movement in the side-to-side direction during the same time period. As a result, in this example the simulation system 102 may determine that the movement of the bounding shapes is likely the result of sensor/perception noise.

In FIG. 4B, diagram 406 shows another example of two different bounding shapes representing an object in a physical environment. The first bounding shape 408 represents the perceived object at a first time (t1), and the second bounding shape 410 represents the same perceived object at a second time (t2). In this example, the simulation system 102 may determine a front point 408(A) and a back point 408(B) on the first bounding shape 408, and similarly may determine a front point 410(A) and a back point 410(B) on the second bounding shape 410. The simulation system 102 then may analyze the movement of the front point and the movement of the back point between time (t1) and time (2), to determine the likely cause of the perceived movement of the bounding shapes representing the object. As shown in this example, the simulation system 102 may determine that the size of the bounding shape changed from time (t1) and time (t2), which may indicate noisy sensor data and/or an occlusion affecting the perception of the object by the sensor system. Accordingly, the simulation system 102 also may determine that the movement of the object (if any) cannot accurately be determined based on the perceived movement of the bounding shapes 408 and 410.

In FIG. 4C, diagram 412 shows another example of two different bounding shapes representing an object in a physical environment. The first bounding shape 414 represents the perceived object at a first time (t1), and the second bounding shape 416 represents the same perceived object at a second time (t2). In this example, the simulation system 102 may determine a front point 414(A) and a back point 414(B) on the first bounding shape 414, and similarly may determine a front point 416(A) and a back point 416(B) on the second bounding shape 416. The simulation system 102 then may analyze the movement of the front point and the movement of the back point between time (t1) and time (2), to determine the likely cause of the perceived movement of the bounding shapes representing the object. In this example, the simulation system 102 may determine a consistent amount of movement along the depth axis between the front point and the back point. The simulation system 102 also may determine that the amount of movement of the bounding shape and the change in yaw of the bounding shape is consistent with realistic movement patterns of the object type. Therefore, in this example, the simulation system 102 may determine that movement between the sequence of bounding boxes 414 and 416 is likely caused by actual movement of the real-world object rather than noisy sensor or perception data.

FIG. 5 is a flow diagram illustrating an example process 500 of analyzing a sequence of bounding shapes associated with an object detected (or perceived) in an environment, and determining an initial movement time for the object based on the analysis. In various examples, the operations of process 500 may be performed by one or more components of a simulation system 102, as described above in reference to FIGS. 1-4. Additionally or alternatively, or more operations of process also be performed by or in conjunction with one or more vehicles and/or other sensor systems configured to capture log data representing an environment.

At operation 502, the simulation system 102 may receive a bounding shape representing an object perceived by a sensor system. As shown in this example, the bounding shape received in operation 502 may represent the object as perceived at a particular time ($T_n$) in an environment. As described above, the bounding shape (e.g., a 2D or 3D bounding box, bounding contour, or other bounding shape) may be included within log data captured of a physical environment. For instance, a vehicle traversing a physical environment may capture and/or generate log data representing the environment, which may include bounding shapes representing the various objects perceived in the environment. A new set of log data including a new set of bounding shapes for the perceived objects in the environment may be captured and/or generated by the vehicle at each time in sequence of times (e.g., sensor data output times, cycle times, etc.) controlled by the sensor systems and/or perception systems of the vehicle capturing the sensor data. Additionally, as described below, the bounding shapes received in operation 502 may include additional associated data, other than the position and location data of the object, such as the velocity, acceleration, yaw, and/or other attributes or features of the perceived object.

At operation 504, the simulation system 102 may use the bounding shape and/or associated object data received in operation 502 to determine the front and back surfaces of the bounding shape. For instance, the simulation system 102 may use the object classification and/or yaw (when provided) to determine the front and back surface of the object. Additionally or alternatively, the simulation system 102 may use the object of one or more machine-learned models configured to detect object attributes/features associated with different object types and/or object surfaces. In some examples, after determining the front and back surfaces of an object, the simulation system 102 may determine a front point at a central or prominent location on the front surface, and a back point at a central or prominent location on the back surface. As described above, determining consistent front and back points on bounding shapes may facilitate determining distance measurements in the forward/backward direction in sequences of bounding shapes over a period of time.

At operation 506, the simulation system 102 may retrieve a previous bounding shape representing the same object in the environment at a previous time, and may compare the previous bounding shape (e.g., size, position, orientation, movement, etc.) to the current bounding shape received in operation 506, to analyze the movement of the bounding shape within the sequence of bounding shapes.

For example, at operation 508, the simulation system 102 may compare the size of the bounding shape received in operation 502 to one or more previous bounding shapes representing the same object in the same environment, to determine whether or the size of the bounding shape is stable. When the simulation system 102 determines that the size of the bounding shape is not stable within the current sequence of bounding shapes (e.g., size differences greater than one or more thresholds) (508:No), the simulation system 102 may determine that the bounding shape size is currently unstable (e.g., due to sensor noise data and/or an occlusion) and the initial movement time of the object cannot be determined. In such examples, process 500 may return to operation 502 to receive a new bounding shape corresponding to the bounding shape for the perceived object at the next subsequent time in the log data.

In this example, when the simulation system 102 determines that the size of the bounding shape is stable within the current sequence of bounding shapes (e.g., size differences less than one or more thresholds) (508:Yes), then in operation 510 the simulation system 102 may determine whether the bounding shape is currently moving in the direction of the depth axis (e.g., forwards/backwards movement along the front-back axis). For instance, the simulation system 102 may determine the dot product of the movement (e.g., frame-to-frame movement for each bounding shape in the sequence of bounding shapes) of the front point of the bounding shape with the depth axis (e.g., back-front axis) of the object, and/or the dot product of the movement of the back point of the bounding shape with the depth axis of the object. These computations may be used to determine a value representing the movement of the in the forward or backward direction, excluding side-to-side movement which may be caused by noise.

When the simulation system 102 determines that the bounding shape is not moving in the forward/backward direction (e.g., based on a forward/backward distance threshold) (510:No), indicating either that the bounding shape is stationary or is moving only in a side-to-side direction, then process 500 may return to operation 502 to receive a new bounding shape corresponding to the bounding shape for the perceived object at the next subsequent time in the log data. In contrast, when the simulation system 102 determines that the bounding shape is moving in the forward/backward direction (e.g., based on a forward/backward distance threshold) and/or is not moving in a side-to-side direction (510:Yes), then in operation 512 the simulation system 102 may determine whether the forwards/backwards movement of the bounding shape is consistent with realistic movement (e.g., acceleration patterns) of the object. In some examples, the simulation system 102 may compare the perceived rate of acceleration of the bounding shape received in operation 502 to an expected range of accelerations (e.g., based on the object classification/type, driving environment, etc.). For instance, the simulation system 102 may compare the perceived acceleration of the received bounding shape to the expected acceleration of an object in the environment. Additionally or alternatively, the simulation system 102 may determine the arc length and progress associated with the movement of the perceived bounding shape over three or more sequential bounding shapes, to compare the total distance traveled by the aggregation of the bounding shapes movements (e.g., arc length) to the distance between the first and last bounding shapes in the sequence (e.g., progress).

When the simulation system 102 determines that the forwards/backwards movement of the bounding shape is inconsistent with realistic movement (e.g., acceleration patterns) of the associated object in a real-world physical environment (512:No), indicating either that the perceived movement of the bounding shape is likely caused by sensor/perception noise, then process 500 may return to operation 502 to receive a new bounding shape corresponding to the bounding shape for the perceived object at the next subsequent time in the log data. In contrast, when the simulation system 102 determines that the forward/backward movement of the bounding shape is consistent with realistic movement of the object in a real-world environment (512:Yes), then at operation 514 the simulation system 102 may determine the current time ($T_n$) as an initial movement time for the object based on the analysis of the movement of the sequence of bounding shapes.

Figure 6:
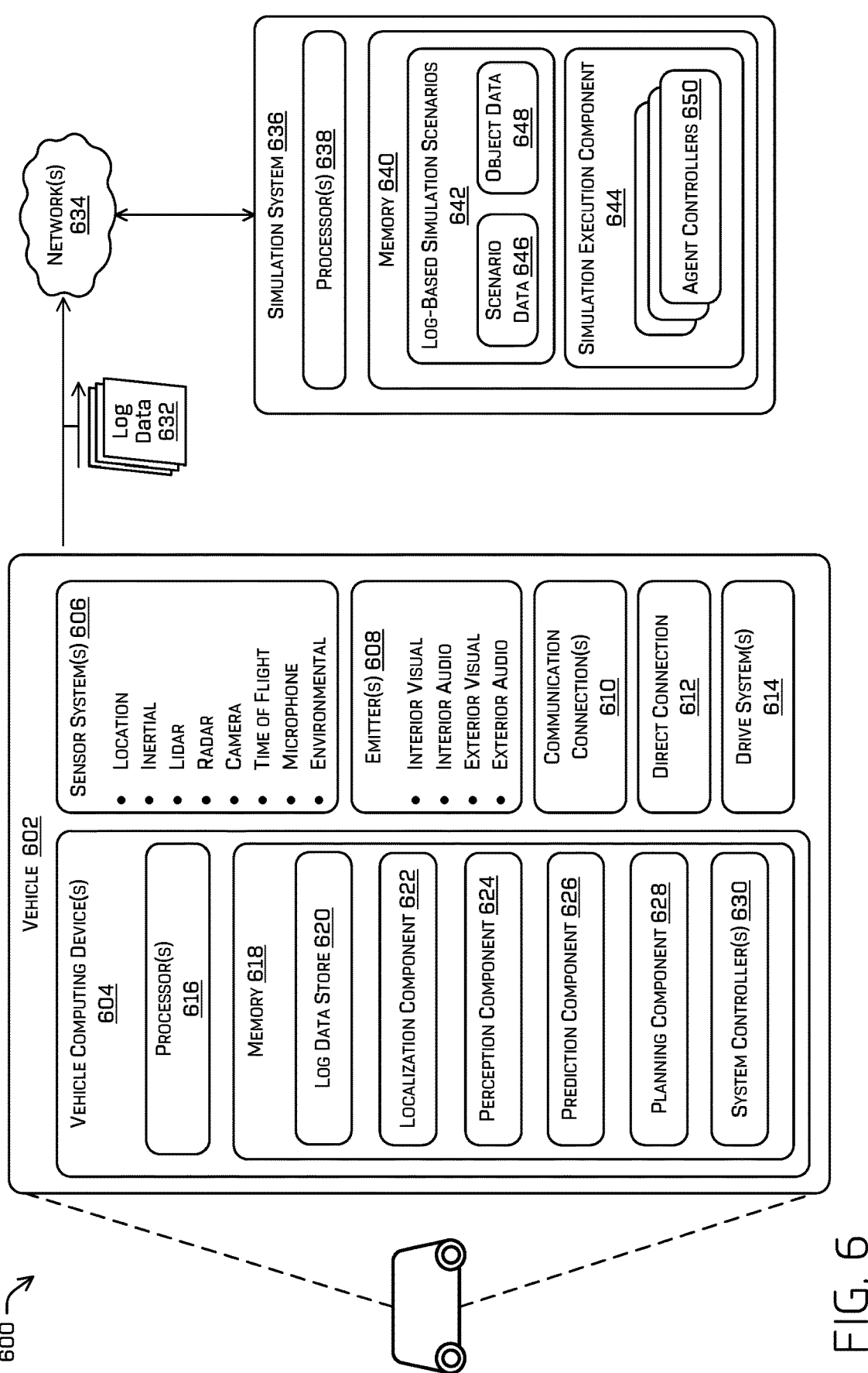
FIG. 6 includes a block diagram of an example architecture of a vehicle and a simulation system for performing driving simulations based on log data, in accordance with one or more examples of the disclosure.

FIG. 6 illustrates an example computing environment 600 that may be used to implement the driving simulation systems according to the techniques described herein. The computing environment 600 may include a vehicle 602 and one or more computing device(s) implementing a simulation system 636. The vehicle 602 may include various software-based and/or hardware-based components of an autonomous vehicle, and may be used to control autonomous vehicles traversing through physical environments and/or simulated vehicles operating within virtual and/or log-based simulations.

In this example, the vehicle 602 and the simulation system 636 and are illustrated as discrete computing systems communicating over one or more networks 634, although in other implementations the functionality of the vehicle 602 and the simulation system 636 may be carried out in the same computing environment. By way of non-limiting example, software executing the functionality of the vehicle 602 may be uploaded or otherwise incorporated into the simulation system 636 and/or software executing the simulation system 636 may be uploaded to or otherwise made incorporated into the vehicle 602.

The vehicle 602 can be a hardware-based and/or software-based controller for a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In some instances, the vehicle 602 may operate within a real associated vehicle, such as a fully or partially autonomous vehicle having any other level or classification. In some instances, the techniques described herein may be usable by non-autonomous vehicles as well. Additionally or alternatively, the vehicle 602 may operate independently from any vehicle, for example, as a hardware and software-based controller for a simulated vehicle executing in a computing environment during the development, testing, and validation processes for the vehicle 602. In addition, while implementations of the vehicle 602 described herein may include simulating a control system of an autonomous vehicle, semi-autonomous vehicle, or a non-autonomous vehicle, some of the techniques may be in a simulated environment, using a simulated vehicle.

The vehicle 602 can be used for any configuration of real or simulated vehicles, such as, for example, a van, a sport utility vehicle, a cross-over vehicle, a truck, a bus, an agricultural vehicle, and/or a construction vehicle. For instance, the associated vehicle for the vehicle 602 can be powered by one or more internal combustion engines, one or more electric motors, hydrogen power, any combination thereof, and/or any other suitable power sources. Although the associated vehicle may have four wheels, the vehicle 602 and associated techniques described herein can be incorporated into vehicles having fewer or a greater number of wheels, and/or tires. The vehicle 602 can control vehicles having four-wheel steering and can operate generally with equal or similar performance characteristics in all directions, for example, such that a first end of the vehicle is the front end of the vehicle when traveling in a first direction, and such that the first end becomes the rear end of the vehicle when traveling in the opposite direction. Similarly, a second end of the vehicle is the front end of the vehicle when traveling in the second direction, and such that the second end becomes the rear end of the vehicle when traveling in the opposite direction. These example characteristics may facilitate greater maneuverability, for example, in small spaces or crowded environments, such as parking lots and/or urban areas.

The vehicle 602 can include a computing device(s) 604, one or more sensor system(s) 606, one or more emitter(s) 608, one or more communication connection(s) 610 (also referred to as communication devices and/or modems), at least one direct connection 612 (e.g., for physically coupling with the vehicle to exchange data and/or to provide power), and one or more drive system(s) 614. The one or more sensor system(s) 606 can be configured to capture sensor data associated with an environment.

The sensor system(s) 606 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 606 can include multiple instances of each of these or other types of sensors. For instance, the time-of-flight sensors can include individual time-of-flight sensors located at the corners, front, back, sides, and/or top of the real or simulated vehicle associated with the vehicle 602. As another example, the camera sensors can include multiple cameras disposed at various locations about the exterior and/or interior of the associated real or simulated vehicle. The sensor system(s) 606 can provide input to the computing device(s) 604.

The vehicle 602 can also include one or more emitter(s) 608 for controller the emitting of light and/or sound via the real or simulated vehicle associated with the vehicle 602. The one or more emitter(s) 608 in this example include interior audio and visual emitters to communicate with passengers of the vehicle. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 608 in this example also include exterior emitters. By way of example and not limitation, the exterior emitters in this example include lights to signal a direction of travel or other indicators of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 602 can also include one or more communication connection(s) 610 that enable communication between the vehicle 602 and one or more other local or remote computing device(s) (e.g., a remote teleoperations computing device) or remote services. For instance, the communication connection(s) 610 can facilitate communication with other local computing device(s) on the associated real or simulated vehicle, and/or the drive system(s) 614. Also, the communication connection(s) 610 can allow the vehicle to communicate with other nearby computing device(s) (e.g., other nearby vehicles, traffic signals, etc.).

The communications connection(s) 610 can include physical and/or logical interfaces for connecting the computing device(s) 604 to another computing device or one or more external networks (e.g., the Internet). For example, the communications connection(s) 610 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short range communications (DSRC), or any suitable wired or wireless communications protocol that enables the respective computing device to interface with the other computing device(s). In at least some examples, the communication connection(s) 610 may comprise the one or more modems as described in detail above.

In at least one example, the vehicle 602 can include one or more drive system(s) 614. In some examples, the real or simulated vehicle associated with the vehicle 602 can have a single drive system 614. In at least one example, if the vehicle has multiple drive systems 614, individual drive systems 614 can be positioned on opposite ends of the associated vehicle (e.g., the front and the rear, etc.). In at least one example, the drive system(s) 614 can include one or more sensor system(s) 606 to detect conditions of the drive system(s) 614 and/or the surroundings of the vehicle. By way of example and not limitation, the sensor system(s) 606 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 614. In some cases, the sensor system(s) 606 on the drive system(s) 614 can overlap or supplement corresponding systems of the vehicle 602 (e.g., sensor system(s) 606).

The drive system(s) 614 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 614 can include a drive system controller which can receive and preprocess data from the sensor system(s) 606 and to control operation of the various vehicle systems. In some examples, the drive system controller can include one or more processor(s) and memory communicatively coupled with the one or more processor(s). The memory can store one or more modules to perform various functionalities of the drive system(s) 614. Furthermore, the drive system(s) 614 also include one or more communication connection(s) that enable communication by the respective drive system with one or more other local or remote computing device(s).

The computing device(s) 604 within the vehicle 602 can include one or more processor(s) 616 and memory 618 communicatively coupled with the one or more processor(s) 616. In the illustrated example, the memory 618 of the vehicle computing device(s) 604 includes log data store 620, a localization component 622, a perception component 624, a prediction component 626, a planning component 628, and one or more system controller(s) 630. Though depicted as residing in the memory 618 for illustrative purposes, it is contemplated that the localization component 622, the perception component 624, the prediction component 626, the planning component 628, and the one or more system controller(s) 630 can additionally, or alternatively, be accessible to the computing device(s) 604 (e.g., stored in a different component of vehicle 602 and/or stored remotely and accessible to the vehicle 602.

The log data store 620 can include map data, vehicle type, software version, vehicle positions, vehicle velocities, vehicle accelerations, or the like overtime during the course of individual trips. In some examples, the log data store 620 can further include raw sensor data and/or data based on sensor data detected at the plurality of vehicles, for example, data identifying characteristics of the environment in which a vehicle was operated, objects within the proximity of the vehicle, attributes or characteristics of the environment and objects (e.g., classifications, sizes, shapes, positions, trajectories, etc.).

The localization component 622 can include functionality to receive data from the sensor system(s) 606 to determine a position of the real vehicle associated with the vehicle 602. For example, the localization component 622 can include and/or request/receive a three-dimensional map of the real environment and can continuously determine a location of the autonomous vehicle within the map. In some instances, the localization component 622 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle.

The perception component 624 can include functionality to perform object detection, segmentation, and/or classification. In some examples, the perception component 624 can provide processed sensor data that indicates a presence of an entity that is proximate to the real or simulated vehicle associated with the vehicle 602 and/or a classification of the entity as an entity type (e.g., car, pedestrian, cyclist, building, tree, road surface, curb, sidewalk, unknown, etc.). In additional and/or alternative examples, the perception component 624 can provide processed sensor data that indicates one or more characteristics associated with a detected entity and/or the real or simulated environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

The prediction component 626 can receive sensor data from the sensor system(s) 606, map data, and/or perception data output from the perception component 624 (e.g., processed sensor data), and can output predictions associated with one or more objects within the environment of the autonomous vehicle. Predictions can include predicted trajectories associated with objects in the environment in which the autonomous vehicle is operating.

The planning component 628 can determine a path for the vehicle 602 to direct the real vehicle through a real environment. For example, the planning component 628 can determine various routes and paths and various levels of detail. In some instances, the planning component 628 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 628 can generate an instruction for guiding the autonomous vehicle along at least a portion of the route from the first location to the second location. In at least one example, the planning component 628 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 628 can alternatively, or additionally, use data from the perception component 624 to determine a path for the real vehicle associated with the vehicle 602 to follow to traverse through an environment. For example, the planning component 628 can receive data from the perception component 624 regarding objects associated with an environment. Using this data, the planning component 628 can determine a route to travel from a first location (e.g., a current location) to a second location (e.g., a target location) to avoid objects in an environment. In at least some examples, such a planning component 628 may determine there is no such collision free path and, in turn, provide a path which brings the vehicle to a safe stop avoiding all collisions and/or otherwise mitigating damage.

The simulation system 636 may be similar or identical to the simulation system 102 described in the various examples above. In some examples, the simulation system 636 can receive log data 632 from one or more vehicles 602, may store and analyze the log data 632 as described herein, and then may perform log-based driving simulations based at least in part on the log data 632. Although not shown in this example, the simulation system 636 also may include log data store(s) similar or identical to the log data store 620. The simulation system 636 may include one or more processors 638 and memory 642 communicatively coupled with the one or more processors 638. In the illustrated example, the memory 642 of the simulation system 636 stores log-based simulation scenarios 642 and simulation execution component 644. As described herein, the log-based simulation scenarios 642 may include scenario data 646 for a number of simulation scenarios that may be executed by the simulation system 636 (e.g., simulated driving environments, driving scenes and scenarios, simulated object data, etc.), and object data 648 (e.g., perceived objects to be represented in log-based simulations and associated initial movement times, etc.). As shown in this example, the simulation execution component 644 may include any number of agent controllers 650 configured to perform the functionality of planner components for simulated agents (e.g., programmatic smart agents) during a simulation.

During execution of a driving simulation, the simulation execution component 644 can control a simulated vehicle based at least in part on the log data 632, where the simulated vehicle follows a simulation trajectory in a simulated environment. In some examples, the simulated vehicle can follow a simulation trajectory corresponding to a previous trajectory for the real vehicle. Alternatively or additionally, the simulation execution component 644 can control the simulated vehicle to follow a simulation trajectory that is generated based at least in part on the two or more previous trajectories for the real vehicle. For example, the log data can include a first trajectory from a first location to a second location at a first time and a second trajectory for the real vehicle from the first location to the second location at a second time. The simulation execution component 644 can generate the simulation trajectory based at least in part on the first trajectory and the second trajectory. For example, the simulation execution component 644 can determine, based on a first set of timestamps associated with the first trajectory, a plurality of first data subsets representing position data associated with the real vehicle when traveling the first trajectory. The simulation execution component 644 can determine, based on a second set of timestamps associated with the second trajectory, a plurality of second data subsets representing position data associated with the real vehicle when traveling the second trajectory. The simulation execution component 644 can further determine, based on the plurality of first data subsets and the plurality of second data subsets, a plurality of positions of the simulated vehicle.

The processor(s) 616 of the computing device(s) 604 and the processor(s) 638 of the simulation system 636 can be any suitable processor capable of executing instructions to process data and perform operations as described herein. By way of example and not limitation, the processor(s) 616 and 638 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 618 of the computing device(s) 604, and the memory 642 of the simulation system 636 are examples of non-transitory computer-readable media. The memory 618 and 642 can store an operating system and one or more software applications, instructions, programs, and/or data to implement the methods described herein and the functions attributed to the various systems. In various implementations, the memory 618 and 642 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, any or all of the components within the memory 618 and memory 642 can be implemented as a neural network.

EXAMPLE CLAUSES

A. A system comprising: one or more processors; and one or more non-transitory computer-readable media storing computer-executable instructions that, when executed, cause the system to perform operations comprising: receiving log data associated with an operation of a vehicle over a time period in a physical environment, the log data including: a first bounding shape representing an object in the physical environment at a first time; and a second bounding shape representing the object in the physical environment at a second time after the first time; determining, based at least in part on the first bounding shape and the second bounding shape, that a perceived extent of the object in the log data at the second time is stable; determining, on the first bounding shape, a first point and a second point; determining, on the second bounding shape, a third point corresponding to the first point on the first bounding shape, and a fourth point corresponding to the second point on the first bounding shape; determining a first movement amount associated with the second bounding shape, based at least in part on the first point and the third point; determining a second movement amount associated with the second bounding shape, based at least in part on the second point and the fourth point; determining, based at least in part on the first movement amount and the second movement amount associated with the second bounding shape, a movement start time associated with the object in the physical environment; executing a simulation based at least in part on the log data, including controlling a simulated agent in a simulated environment, wherein the simulated environment is based at least in part on the physical environment; and controlling the simulated agent in the simulated environment based at least in part on the movement start time associated with the object in the physical environment.

B. The system paragraph A, wherein controlling the simulated agent comprises: determining a first simulation time in the simulation corresponding to the movement start time associated with the object in the physical environment; controlling the simulated agent, at a second simulation time after the first simulation time, to correspond to the object in the physical environment; and determining, at a third simulation time after the second simulation time, a programmatic planner component for controlling the simulated agent in the simulated environment.

C. The system of paragraph A, wherein: determining the first point comprises determining, based at least in part on a yaw of the first bounding shape, a front point on a front surface of the first bounding shape; and determining the second point comprises determining, based at least in part on the yaw of the first bounding shape, a back point on a back surface of the first bounding shape.

D. The system of paragraph A, wherein: determining the first point comprises determining a first object feature on a surface of the first bounding shape; and determining the third point comprises determining a second object feature, corresponding to the first object feature, on the second bounding shape.

E. The system of paragraph A, wherein determining the movement start time associated with the object comprises: determining a first velocity associated with the first point, based at least in part on the first movement amount; determining a second velocity associated with the second point, based at least in part on the second movement amount; and determining that a difference between the first velocity and the second velocity is less than a velocity difference threshold.

F. A method comprising: receiving log data associated with an operation of a vehicle over a time period in an environment, the log data including: first object data representing an object in the environment at a first time, the first object data having a first extent; and second object data representing the object in the environment at a second time after the first time, the second object data having a second extent; determining, based at least in part on the first extent and the second extent, that a representation of the object in the log data at the second time is stable; determining, on the first object data, a first point and a second point; determining, on the second object data, a third point and a fourth point, wherein the third point is associated with the first point on the first object data, and wherein the fourth point is associated with the second point on the first object data; determining, based at least in part on the first point and the third point, a first movement associated with the representation of the object in the log data; determining, based at least in part on the second point and the fourth point, a second movement associated with the representation of the object in the log data; determining, based at least in part on the first movement and the second movement, a movement start time associated with the object in the environment;

executing a simulation based at least in part on the log data, including controlling a simulated agent in a simulated environment, wherein the simulated environment is based at least in part on the environment; and controlling the simulated agent in the simulated environment based at least in part on the movement start time associated with the object in the physical environment.

G. The method of paragraph F, wherein controlling the simulated agent comprises: determining a first simulation time in the simulation corresponding to the movement start time associated with the object in the environment; controlling the simulated agent, at a second simulation time after the first simulation time, to correspond to the object in the environment; and determining, at a third simulation time after the second simulation time, a programmatic planner component for controlling the simulated agent in the simulated environment.

H. The method of paragraph F, wherein the first object data comprises at least one of a first bounding shape or a first point cloud representing the object at the first time, and wherein the second object data comprises at least one of a second bounding shape or a second point cloud representing the object at the second time.

I. The method of paragraph F, wherein: determining the first point comprises determining a front point on a boundary of the first object data, based at least in part on a yaw associated with the first object data, and determining the second point comprises determining a back point on the boundary of the first object data, based at least in part on the yaw associated with the first object data.

J. The method of paragraph F, wherein: determining the first point comprises determining a first feature on a boundary of the first object data, and determining the third point comprises determining, on a boundary of the second object data, a second feature corresponding to the first feature.

K. The method of paragraph F, wherein determining the movement start time associated with the object comprises: determining a first velocity associated with the first point, based at least in part on the first movement; determining a second velocity associated with the second point, based at least in part on the second movement; and determining that a difference between the first velocity and the second velocity is less than a velocity difference threshold.

L. The method of paragraph F, wherein the log data further includes third object data representing the object in the environment at a third time after the second time, and wherein determining the movement start time associated with the object comprises determining: a first perceived distance traveled by the representation of the object during a time period between the first time and the third time; and a second perceived distance between the representation of the object in the first object data and the representation of the object in the third object data.

M. The method of paragraph F, wherein determining the movement start time associated with the object comprises: determining, based at least in part on the first movement and the second movement, a perceived acceleration associated with the representation of the object; determining a range of acceleration values associated with the object; and comparing the perceived acceleration associated with the representation of the object to the range of acceleration values.

N. One or more non-transitory computer-readable media storing instructions executable by one or more processors, wherein the instructions, when executed, cause the one or more processors to perform operations comprising: receiving log data associated with an operation of a vehicle over a time period in an environment, the log data including: first object data representing an object in the environment at a first time, the first object data having a first extent; and second object data representing the object in the environment at a second time after the first time, the second object data having a second extent; determining, based at least in part on the first extent and the second extent, that a representation of the object in the log data at the second time is stable; determining, on the first object data, a first point and a second point; determining, on the second object data, a third point and a fourth point, wherein the third point is associated with the first point on the first object data, and wherein the fourth point is associated with the second point on the first object data; determining, based at least in part on the first point and the third point, a first movement associated with the representation of the object in the log data; determining, based at least in part on the second point and the fourth point, a second movement associated with the representation of the object in the log data; determining, based at least in part on the first movement and the second movement, a movement start time associated with the object in the environment; executing a simulation based at least in part on the log data, including controlling a simulated agent in a simulated environment, wherein the simulated environment is based at least in part on the environment; and controlling the simulated agent in the simulated environment based at least in part on the movement start time associated with the object in the physical environment.

O. The one or more non-transitory computer-readable media of paragraph N, wherein controlling the simulated agent comprises: determining a first simulation time in the simulation corresponding to the movement start time associated with the object in the environment; controlling the simulated agent, at a second simulation time after the first simulation time, to correspond to the object in the environment; and determining, at a third simulation time after the second simulation time, a programmatic planner component for controlling the simulated agent in the simulated environment.

P. The one or more non-transitory computer-readable media of paragraph N, wherein the first object data comprises at least one of a first bounding shape or a first point cloud representing the object at the first time, and wherein the second object data comprises at least one of a second bounding shape or a second point cloud representing the object at the second time.

Q. The one or more non-transitory computer-readable media of paragraph N, wherein: determining the first point comprises determining a front point on a boundary of the first object data, based at least in part on a yaw associated with the first object data, and determining the second point comprises determining a back point on the boundary of the first object data, based at least in part on the yaw associated with the first object data.

R. The one or more non-transitory computer-readable media of paragraph N, wherein: determining the first point comprises determining a first feature on a boundary of the first object data, and determining the third point comprises determining, on a boundary of the second object data, a second feature corresponding to the first feature.

S. The one or more non-transitory computer-readable media of paragraph N, wherein determining the movement start time associated with the object comprises: determining a first velocity associated with the first point, based at least in part on the first movement; determining a second velocity associated with the second point, based at least in part on the second movement; and determining that a difference between the first velocity and the second velocity is less than a velocity difference threshold.

T. The one or more non-transitory computer-readable media of paragraph N, wherein the log data further includes third object data representing the object in the environment at a third time after the second time, and wherein determining the movement start time associated with the object comprises determining: a first perceived distance traveled by the representation of the object during a time period between the first time and the third time; and a second perceived distance between the representation of the object in the first object data and the representation of the object in the third object data.

While the example clauses described above are described with respect to particular implementations, it should be understood that, in the context of this document, the content of the example clauses can be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code modules and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
one or more processors; and
one or more non-transitory computer-readable media storing computer-executable instructions that, when executed, cause the system to perform operations comprising:
receiving log data associated with an operation of a vehicle over a time period in a physical environment, the log data including:
a first bounding shape representing an object in the physical environment at a first time; and
a second bounding shape representing the object in the physical environment at a second time after the first time;
determining, based at least in part on the first bounding shape and the second bounding shape, that a perceived extent of the object in the log data at the second time is stable;
determining, on the first bounding shape, a first point and a second point;
determining, on the second bounding shape, a third point corresponding to the first point on the first bounding shape, and a fourth point corresponding to the second point on the first bounding shape;
determining a first movement amount associated with the second bounding shape, based at least in part on the first point and the third point;
determining a second movement amount associated with the second bounding shape, based at least in part on the second point and the fourth point;
determining, based at least in part on the first movement amount and the second movement amount associated with the second bounding shape, a movement start time associated with the object in the physical environment;
executing a simulation based at least in part on the log data, including controlling a simulated agent in a simulated environment, wherein the simulated environment is based at least in part on the physical environment; and
controlling the simulated agent in the simulated environment based at least in part on the movement start time associated with the object in the physical environment.

2. The system claim 1, wherein controlling the simulated agent comprises:
determining a first simulation time in the simulation corresponding to the movement start time associated with the object in the physical environment;
controlling the simulated agent, at a second simulation time after the first simulation time, to correspond to the object in the physical environment; and
determining, at a third simulation time after the second simulation time, a programmatic planner component for controlling the simulated agent in the simulated environment.

3. The system of claim 1, wherein:
determining the first point comprises determining, based at least in part on a yaw of the first bounding shape, a front point on a front surface of the first bounding shape; and
determining the second point comprises determining, based at least in part on the yaw of the first bounding shape, a back point on a back surface of the first bounding shape.

4. The system of claim 1, wherein:
determining the first point comprises determining a first object feature on a surface of the first bounding shape; and
determining the third point comprises determining a second object feature, corresponding to the first object feature, on the second bounding shape.

5. The system of claim 1, wherein determining the movement start time associated with the object comprises:
determining a first velocity associated with the first point, based at least in part on the first movement amount;
determining a second velocity associated with the second point, based at least in part on the second movement amount; and
determining that a difference between the first velocity and the second velocity is less than a velocity difference threshold.

6. A method comprising:
receiving log data associated with an operation of a vehicle over a time period in an environment, the log data including:
first object data representing an object in the environment at a first time, the first object data having a first extent; and
second object data representing the object in the environment at a second time after the first time, the second object data having a second extent;
determining, based at least in part on the first extent and the second extent, that a representation of the object in the log data at the second time is stable;
determining, on the first object data, a first point and a second point;
determining, on the second object data, a third point and a fourth point, wherein the third point is associated with the first point on the first object data, and wherein the fourth point is associated with the second point on the first object data;

determining, based at least in part on the first point and the third point, a first movement associated with the representation of the object in the log data;

determining, based at least in part on the second point and the fourth point, a second movement associated with the representation of the object in the log data;

determining, based at least in part on the first movement and the second movement, a movement start time associated with the object in the environment;

executing a simulation based at least in part on the log data, including controlling a simulated agent in a simulated environment, wherein the simulated environment is based at least in part on the environment; and controlling the simulated agent in the simulated environment based at least in part on the movement start time associated with the object in the physical environment.

7. The method of claim 6, wherein controlling the simulated agent comprises:

determining a first simulation time in the simulation corresponding to the movement start time associated with the object in the environment;

controlling the simulated agent, at a second simulation time after the first simulation time, to correspond to the object in the environment; and determining, at a third simulation time after the second simulation time, a programmatic planner component for controlling the simulated agent in the simulated environment.

8. The method of claim 6, wherein the first object data comprises at least one of a first bounding shape or a first point cloud representing the object at the first time, and wherein the second object data comprises at least one of a second bounding shape or a second point cloud representing the object at the second time.

9. The method of claim 6, wherein:

determining the first point comprises determining a front point on a boundary of the first object data, based at least in part on a yaw associated with the first object data, and determining the second point comprises determining a back point on the boundary of the first object data, based at least in part on the yaw associated with the first object data.

10. The method of claim 6, wherein:

determining the first point comprises determining a first feature on a boundary of the first object data, and determining the third point comprises determining, on a boundary of the second object data, a second feature corresponding to the first feature.

11. The method of claim 6, wherein determining the movement start time associated with the object comprises:

determining a first velocity associated with the first point, based at least in part on the first movement;

determining a second velocity associated with the second point, based at least in part on the second movement; and determining that a difference between the first velocity and the second velocity is less than a velocity difference threshold.

12. The method of claim 6, wherein the log data further includes third object data representing the object in the environment at a third time after the second time, and wherein determining the movement start time associated with the object comprises determining:

a first perceived distance traveled by the representation of the object during a time period between the first time and the third time; and a second perceived distance between the representation of the object in the first object data and the representation of the object in the third object data.

13. The method of claim 6, wherein determining the movement start time associated with the object comprises:

determining, based at least in part on the first movement and the second movement, a perceived acceleration associated with the representation of the object;

determining a range of acceleration values associated with the object; and comparing the perceived acceleration associated with the representation of the object to the range of acceleration values.

14. One or more non-transitory computer-readable media storing instructions executable by one or more processors, wherein the instructions, when executed, cause the one or more processors to perform operations comprising:

receiving log data associated with an operation of a vehicle over a time period in an environment, the log data including:

first object data representing an object in the environment at a first time, the first object data having a first extent; and second object data representing the object in the environment at a second time after the first time, the second object data having a second extent;

determining, based at least in part on the first extent and the second extent, that a representation of the object in the log data at the second time is stable;

determining, on the first object data, a first point and a second point;

determining, on the second object data, a third point and a fourth point, wherein the third point is associated with the first point on the first object data, and wherein the fourth point is associated with the second point on the first object data;

determining, based at least in part on the first point and the third point, a first movement associated with the representation of the object in the log data;

determining, based at least in part on the second point and the fourth point, a second movement associated with the representation of the object in the log data;

determining, based at least in part on the first movement and the second movement, a movement start time associated with the object in the environment;

executing a simulation based at least in part on the log data, including controlling a simulated agent in a simulated environment, wherein the simulated environment is based at least in part on the environment; and controlling the simulated agent in the simulated environment based at least in part on the movement start time associated with the object in the physical environment.

15. The one or more non-transitory computer-readable media of claim 14, wherein controlling the simulated agent comprises:

determining a first simulation time in the simulation corresponding to the movement start time associated with the object in the environment;

controlling the simulated agent, at a second simulation time after the first simulation time, to correspond to the object in the environment; and determining, at a third simulation time after the second simulation time, a programmatic planner component for controlling the simulated agent in the simulated environment.

16. The one or more non-transitory computer-readable media of claim 14, wherein the first object data comprises at least one of a first bounding shape or a first point cloud representing the object at the first time, and wherein the second object data comprises at least one of a second bounding shape or a second point cloud representing the object at the second time.

17. The one or more non-transitory computer-readable media of claim 14, wherein:

determining the first point comprises determining a front point on a boundary of the first object data, based at least in part on a yaw associated with the first object data, and determining the second point comprises determining a back point on the boundary of the first object data, based at least in part on the yaw associated with the first object data.

18. The one or more non-transitory computer-readable media of claim 14, wherein:

determining the first point comprises determining a first feature on a boundary of the first object data, and determining the third point comprises determining, on a boundary of the second object data, a second feature corresponding to the first feature.

19. The one or more non-transitory computer-readable media of claim 14, wherein determining the movement start time associated with the object comprises:

determining a first velocity associated with the first point, based at least in part on the first movement;

determining a second velocity associated with the second point, based at least in part on the second movement; and determining that a difference between the first velocity and the second velocity is less than a velocity difference threshold.

20. The one or more non-transitory computer-readable media of claim 14, wherein the log data further includes third object data representing the object in the environment at a third time after the second time, and wherein determining the movement start time associated with the object comprises determining:

a first perceived distance traveled by the representation of the object during a time period between the first time and the third time; and a second perceived distance between the representation of the object in the first object data and the representation of the object in the third object data.

* * * * *